(12) United States Patent
Park et al.

(10) Patent No.: US 8,803,248 B2
(45) Date of Patent: Aug. 12, 2014

(54) SEMICONDUCTOR DEVICES AND METHODS OF MANUFACTURING THE SAME

(75) Inventors: Sang-Jine Park, Yongin-si (KR); Bo-Un Yoon, Seoul (KR); Jeong-Nam Han, Seoul (KR); Myung-Geun Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/241,324

(22) Filed: Sep. 23, 2011

(65) Prior Publication Data

US 2012/0104514 A1 May 3, 2012

(30) Foreign Application Priority Data

Nov. 3, 2010 (KR) ......................... 10-2010-0108669

(51) Int. Cl.
*H01L 27/088* (2006.01)
(52) U.S. Cl.
USPC .... 257/401; 257/288; 257/387; 257/E29.121; 257/E29.122
(58) Field of Classification Search
USPC .......... 257/311, 411, 288, 353, 354, E29.121, 257/E29.122, 387, 401
See application file for complete search history.

(56) References Cited

U.S. PATENT DOCUMENTS

| | | | |
|---|---|---|---|
| 6,190,979 B1 * | 2/2001 | Radens et al. | 438/301 |
| 7,151,018 B1 * | 12/2006 | Nunan et al. | 438/176 |
| 7,435,671 B2 * | 10/2008 | Fuller et al. | 438/591 |
| 8,551,831 B2 * | 10/2013 | Gao et al. | 438/199 |
| 2004/0070045 A1 * | 4/2004 | Suguro et al. | 257/506 |
| 2005/0095799 A1 * | 5/2005 | Wang et al. | 438/303 |
| 2005/0218448 A1 * | 10/2005 | Kim et al. | 257/333 |
| 2008/0185636 A1 * | 8/2008 | Luo et al. | 257/327 |
| 2010/0187575 A1 * | 7/2010 | Baumgartner et al. | 257/255 |
| 2010/0327402 A1 * | 12/2010 | Kim | 257/529 |
| 2011/0165739 A1 * | 7/2011 | Majumdar et al. | 438/154 |
| 2011/0193167 A1 * | 8/2011 | Fung et al. | 257/350 |
| 2012/0056245 A1 * | 3/2012 | Kang et al. | 257/192 |
| 2012/0086054 A1 * | 4/2012 | Cheng et al. | 257/288 |
| 2012/0115298 A1 * | 5/2012 | Kim et al. | 438/299 |
| 2012/0168711 A1 * | 7/2012 | Crowder et al. | 257/9 |
| 2012/0273847 A1 * | 11/2012 | Tsai et al. | 257/255 |
| 2012/0309157 A1 * | 12/2012 | Iwamatsu et al. | 438/299 |

FOREIGN PATENT DOCUMENTS

| | | |
|---|---|---|
| JP | 2000-223703 | 8/2000 |
| KR | 1020010045139 A | 11/1999 |
| KR | 1020020003625 A | 1/2002 |

* cited by examiner

*Primary Examiner* — Eduardo A Rodela
(74) *Attorney, Agent, or Firm* — Myers Bigel Sibley & Sajovec, P.A.

(57) ABSTRACT

Provided are a semiconductor device, which can facilitate a salicide process and can prevent a gate from being damaged due to misalign, and a method of manufacturing of the semiconductor device. The method includes forming a first insulation layer pattern on a substrate having a gate pattern and a source/drain region formed at both sides of the gate pattern, the first insulation layer pattern having an exposed portion of the source/drain region, forming a silicide layer on the exposed source/drain region, forming a second insulation layer on the entire surface of the substrate to cover the first insulation layer pattern and the silicide layer, and forming a contact hole in the second insulation layer to expose the silicide layer.

6 Claims, 13 Drawing Sheets

SEMICONDUCTOR DEVICES AND METHODS OF MANUFACTURING THE SAME

CROSS-REFERENCE TO RELATED APPLICATION

This application claims priority from Korean Patent Application No. 10-2010-0108669 filed on Nov. 3, 2010 in the Korean Intellectual Property Office, and all the benefits accruing therefrom under 35 U.S.C. 119, the contents of which in its entirety are herein incorporated by reference.

BACKGROUND

A recent trend toward high integration of semiconductor devices uses a gate electrode of a memory device that occupies an increasingly smaller space. In this regard, the width and contact area of the gate electrode may be gradually reduced. Accordingly, contact resistance and sheet resistance of the gate electrode tend to increase, which may undesirably lower the operating speed. Therefore, a salicide (self-aligned silicide) process in which a metal gate is employed in order to reduce the resistance has been studied and developed.

However, since a highly integrated semiconductor device may have a reduced gate line width compared to a height of the gate electrode, it may not be easy to deposit the metal material during the salicide process. In addition, in a case where the metal gate and the salicide process are both employed, the metal gate may be dissolved in a wet-etching solution used in the salicide process or a metal stripping material. As such the metal gate may be damaged. Further, the more highly integrated the semiconductor device, the smaller the manufacturing margin thereof. Thus, in a case where misalignment occurs during the salicide process, a probability of the metal gate being damage may be increased.

SUMMARY

Some embodiments of the present invention provide semiconductor devices, which can facilitate a salicide process and can reduce or prevent damage to a gate due to misalignment.

Some embodiments of the present invention provide methods of manufacturing of semiconductor devices.

These and other objects of the present inventive concept will be described in or be apparent from the following description.

According to an aspect of the present disclosure, methods of manufacturing of a semiconductor device may include forming a first insulation layer pattern on a substrate having a gate pattern and a source/drain region formed at both sides of the gate pattern, the first insulation layer pattern having an exposed portion of the source/drain region. Operations may include forming a silicide layer on the exposed source/drain region, forming a second insulation layer on the entire surface of the substrate to cover the first insulation layer pattern and the silicide layer, and forming a contact hole in the second insulation layer to expose the silicide layer.

Some embodiments provide that methods of manufacturing a semiconductor device may include forming on a substrate a dummy gate pattern and source/drain region formed at both sides of the gate pattern, forming a passivation layer on the dummy gate pattern and the source/drain region, and removing the passivation layer to expose the dummy gate pattern and removing the exposed dummy gate pattern. Operations may further include forming a gate insulation layer and a metal layer on the entire surface of the substrate to cover a region having the dummy gate pattern removed therefrom and the passivation layer, and forming a metal gate pattern by performing planarization until the passivation layer is exposed. The passivation layer may be removed and a first insulation layer pattern may be formed on the entire surface of the substrate having a portion of the source/drain region exposed. Operations may further include forming a silicide layer on the exposed source/drain region, forming a second insulation layer pattern on the entire surface of the substrate to cover the first insulation layer pattern and the silicide layer, and forming a contact hole in the second insulation layer to expose the silicide layer.

In some embodiments, a semiconductor device includes a gate pattern including a gate insulation layer and a gate electrode formed on a substrate, a source/drain region formed at both sides of the gate pattern, a silicide layer formed on the source/drain region, a contact hole formed on the silicide layer, and an insulation layer formed on the gate pattern and the source/drain region and including the contact hole formed therein. Some embodiments provide that the gate pattern and the source/drain region have an aspect ratio of 3:1 or less.

In some embodiments, a semiconductor device may include a gate pattern including a gate insulation layer and a gate electrode formed on a substrate, a source/drain region formed at both sides of the gate pattern, a silicide layer formed on the source/drain region, a contact hole formed on the silicide layer, and an insulation layer formed on the gate pattern and the source/drain region and including the contact hole formed therein, wherein the gate pattern and the source/drain region have an aspect ratio of 3:1 or less.

As described above, in the methods disclosed herein, since a silicide layer is formed on a source/drain region before forming a contact hole, a difficulty with deposition of a metal during a salicide process performed after forming the contact hole can be overcome.

In addition, in the methods disclosed herein, it is possible to reduce or prevent damage to a metal gate due to misalignment during a salicide process.

Further, since the semiconductor devices disclosed herein may have a relatively small step difference between a source/drain region and a gate, which reduces an aspect ratio of a contact hole, efficiency of subsequent processes may be increased.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION

Advantages and features of the present disclosure and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

Embodiments described herein will be described referring to plan views and/or cross-sectional views by way of ideal schematic views of the invention. Accordingly, the example views may be modified depending on manufacturing technologies and/or tolerances. Therefore, the embodiments disclosed herein are not limited to those shown in the views, but include modifications in configuration formed on the basis of manufacturing processes. Therefore, regions exemplified in figures have schematic properties and shapes of regions shown in figures, exemplify specific shapes of regions of elements and do not limit aspects of the disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the embodiments disclosed herein will be described in further detail with reference to the accompanying drawings.

A semiconductor device according to some embodiments will now be described in more detail with reference to FIG. 1, which is a cross-sectional view of a semiconductor device according to some embodiments of the present disclosure.

Figure 1:
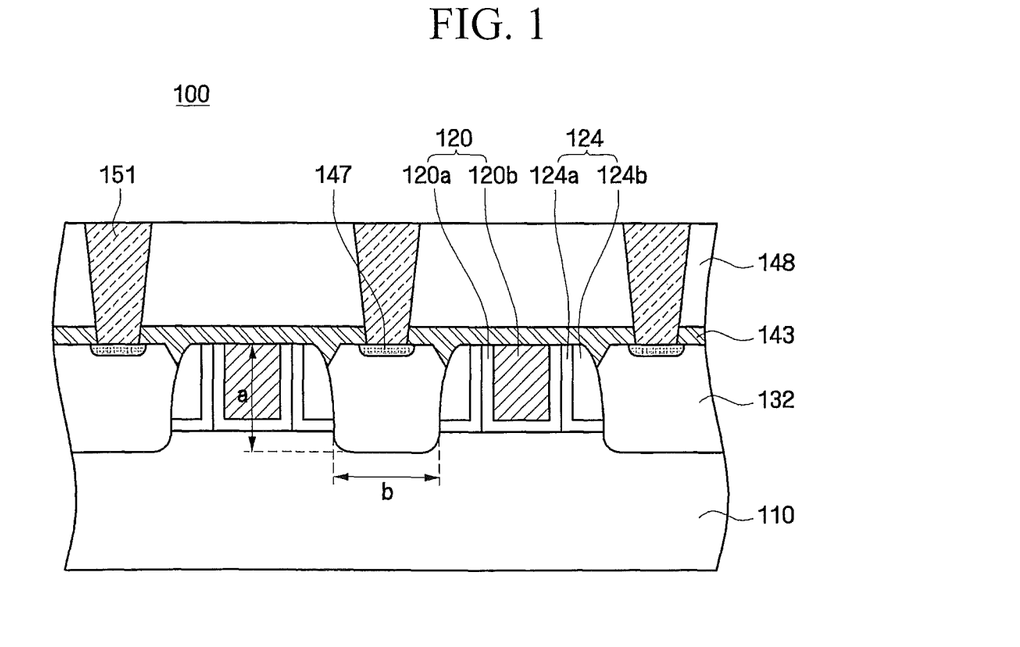
FIG. 1 is a cross-sectional view of a semiconductor device according to some embodiments disclosed herein.

Referring to FIG. 1, the semiconductor device 100 according to the illustrated embodiment includes a gate pattern 120, a source/drain region 132, a silicide layer 147, a contact hole 151, a first insulation layer 143 and a second insulation layer 148. The semiconductor device 100 according to the illustrated embodiments may further include a gate spacer 124.

The gate pattern 120 is formed on a substrate 110 and includes a gate insulation layer 120a and a gate electrode 120b.

The substrate 110 may be a silicon substrate, an SOI (Silicon On Insulator) substrate, a gallium arsenic substrate, a silicon germanium substrate, a ceramic substrate, a rigid substrate such as a quartz substrate or a glass substrate for a display, or a substrate made of a flexible plastic such as polyimide, polyester, polycarbonate, polyethersulfone, polymethylmethacrylate, polyethylenenaphthalate, and/or polyethyleneterephthalate, among others.

The gate insulation layer 120a may use a silicon oxide layer, SiON, $Ge_xO_yN_z$, $Ge_xSi_yO_z$, a highly dielectric material, combinations of these materials, and/or a stack of layers formed by sequentially stacking these materials. Here, the highly dielectric material is formed using $HfO_2$, $ZrO_2$, $Al_2O_3$, $Ta_2O_5$, hafnium silicate, zirconium silicate or a combination thereof but not limited thereto. FIG. 1 illustrates a structure in which the gate insulation layer 120a surrounds sidewalls and a bottom of the gate electrode 120b, but a structure in which the gate electrode 120b is stacked on the gate insulation layer 120a may also be applied to embodiments disclosed herein.

The gate electrode 120b may be formed of a single film of poly-Si, poly-SiGe, impurity-doped poly-Si, a metal such as Ta, TaN, TaSiN, TiN, Mo, Ru, Ni, or NiSi, or metal silicide, or a stacked film of a combination of these materials, but not limited thereto. Some embodiments provide that the gate electrode 26 may be formed of a metal or metal silicide capable of implementing low resistance on a finer line width while not necessitating doping of impurities.

Although not shown in FIG. 1, a hard mask film that protects the gate electrode 120b may be formed on the gate electrode 120b. Here, the hard mask film may be formed of SiN or SiON.

The gate spacer 124 is formed on sidewalls of the gate insulation layer 120a and the gate electrode 120b to protect the gate electrode 120b.

The gate spacer 124 may include a first spacer 124a and a second spacer 124b. The first spacer 124a may be formed of a silicon oxide film, and the second spacer 124b may be formed of a silicon nitride film.

The source/drain region 132 is formed at both sides of the gate pattern 120, respectively and may have an elevated structure in which the source/drain region 132 is elevated from the substrate 110, thereby forming a junction having a constant depth. The elevated source and drain region structure is formed on a top surface of the substrate 110 having a penetration range (Rp) caused by impurity implementation, thereby obtaining a shallow junction structure. Accordingly, deterioration in the device characteristic due to a short channel effect can be improved.

The source/drain region 132 may be formed of an epitaxially grown silicon layer. Specifically, in order to suppress diffusion of impurities and improve mobility of carriers in a channel region, an NMOS is formed by implanting an impurity such as phosphorus (P) as an n-type dopant into Si or a SiC epitaxial layer, while a PMOS is formed by implanting an impurity such as boron (B) as an n-type dopant into a SiGe epitaxial layer. In addition, since the source/drain region 132 has a facet formed on upper side surface, a gap between the source/drain region 132 and the gate pattern 120 may be created at a portion where a facet of the source/drain region 132 is formed.

The gate pattern 120 and the source/drain region 132 may have an aspect ratio of 3:1 or less. As used herein, the aspect ratio refers to a ratio of a step difference (a) between a top portion of the gate pattern 120 and a top portion of the source/drain region 132 to a width (b) of the source/drain region 132. When the aspect ratio is 3:1 or less, uniform deposition may be achieved in a subsequent process. The gate pattern 120 and the source/drain region 132 may have a step difference of 250 Å or less from the substrate 110. If the step difference between the gate pattern 120 and the source/drain region 132 is 250 Å or less, the aspect ratio may be reduced, thereby facilitating deposition in a subsequent deposition process performed on the gate pattern 120 and the source/drain region 132 and forming a uniformly deposited film.

The source/drain region 132 may be formed to have the same height as the gate pattern 120. FIG. 1 illustrates a structure in which the source/drain region 132 is elevated as high as the gate pattern 120.

The silicide layer 147 is formed on the source/drain region 132 to reduce contact resistance. The silicide layer 147 may be formed by depositing a metal layer on the source/drain region 132 and reacting the metal layer with the source/drain region 132, followed by removing the unreacted portion of the metal layer.

The silicide layer 147 may include Ni, Co, Pt or Ti, and may be formed by being permeated to the top portion of the source/drain region 132 to a predetermined depth. Alternatively, the silicide layer 147 may be formed on the source/drain region 132 to a predetermined height.

The first insulation layer 143 is formed on the gate pattern 120 and the source/drain region 132. The first insulation layer 143 serves to planarize the surface of the substrate 110 having the gate pattern 120 and the source/drain region 132 while substantially completely covering the gate pattern 120 and the source/drain region 132. In addition, the first insulation layer 143 serves to prevent the gate electrode from being damaged in a subsequent process by filling the gap by the facet of the source/drain region 132. Further, the first insulation layer 143 may function as an etch stopper in an etching process of forming, for example, a contact hole 151. Therefore, the first insulation layer 143 may be formed of a material having a different etch ratio from the second insulation layer 148. Specifically, the first insulation layer 143 may be formed by a silicon oxide film, a silicon nitride film, or a double-layered structure of these films. The first insulation layer 143 may be formed by a silicon nitride film.

The second insulation layer 148 is formed on the first insulation layer 143, and may be formed of, but is not limited to, a silicon oxide film, a silicon nitride film, or a multiple-layered structure of one or more of these films.

The contact hole 151 is formed in the first insulation layer 143 and the second insulation layer 148 to expose the predetermined region of the silicide layer 147. In detail, since the contact hole 151 is formed on the silicide layer 147, the silicide layer 147 is exposed at the bottom of the contact hole 151, thereby reducing contact resistance while not necessitating separately forming a silicide layer in the bottom of the contact hole 151. The contact hole 151 may be filled with a metal such as tungsten (W).

In the illustrated embodiments, the source/drain region 132 and the gate pattern 120 may have a relatively small step difference and the contact hole 151 is formed on the silicide layer 147. Therefore, even if misalignment occurs during formation of the contact hole, it is possible to prevent the gate electrode from being damaged.

Figure 2:
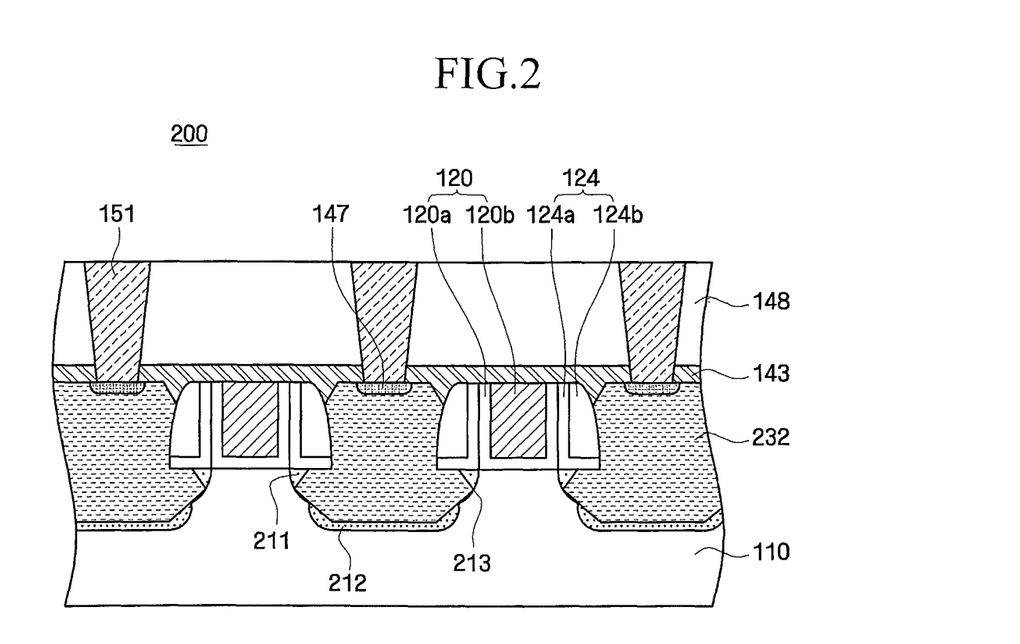
FIG. 2 is a cross-sectional view of a semiconductor device according to some embodiments disclosed herein.

Next, a semiconductor device 200 according to other embodiments disclosed herein will be described with reference to FIG. 2, which is a cross-sectional view of a semiconductor device according to such embodiments.

The semiconductor device 200 is different from the semiconductor device 100 shown in FIG. 1 in that it has a source and drain region 232 different from the corresponding portion of the previous embodiment in view of configuration, including a lightly doped source/drain region 211 and a heavily doped source/drain region 212. Thus, the following description of the illustrated semiconductor device will focus on the differences from the previously described embodiments of FIG. 1. Accordingly, the same reference numerals will be used to refer to the same elements as those described in FIG. 1, and detailed explanation thereof may be omitted.

The source and drain regions 232 may be formed of an epitaxial layer formed in a trench formed by etching a predetermined area of the substrate 110. In detail, a preliminary trench is formed in the substrate 110 and a trench for epitaxial formation is formed by further laterally etching sidewalls of the preliminary trench, followed by being subjected to epitaxial growth in the trench for epitaxial formation.

The trench for epitaxial formation may have a hexagonal profile, and the epitaxial layer may be a silicon layer or a silicon germanium (SiGe) layer formed by being subjected to epitaxial growth in the trench for epitaxial formation. The silicon germanium layer may increase current by applying a compressive stress to a channel region to increase the mobility of holes. A tip 213 corresponding to a portion of the trench having the maximum width may be positioned on the same line or may be aligned with the sidewalls of the gate pattern 120. Since the silicon germanium layer formed in the trench for epitaxial formation is formed closer to the channel region, the compressive stress applied to the channel region is increased thereby further increasing the mobility of holes.

A top portion of the epitaxial layer may be formed higher than a top portion of the substrate. An aspect ratio of the source/drain region 232 formed of the epitaxial layer to gate pattern 120 may be 3:1 or less. In addition, the source and drain region 232 and the gate pattern 120 may have a step difference of 250 Å or less. Further, the epitaxial layer may be formed to have the same height as the gate pattern 120.

The lightly doped source/drain region 211 and the heavily doped source/drain region 212 surround a peripheral portion of the trench, and the trench may be formed in the lightly doped source/drain region 211 and the heavily doped source/drain region 212. A PMOS transistor may be formed using p-type impurity such as boron (B), and an NMOS transistor may be formed using n-type impurity such as phosphorus (P) or arsenic (As).

The lightly doped source/drain region 211 is formed by implanting impurity into the substrate in both sides of the gate pattern 120, and the heavily doped source/drain region 212 is formed by implanting impurity into a lower portion of the lightly doped source/drain region 211 from both sides of the gate spacer 124.

Figure 3:
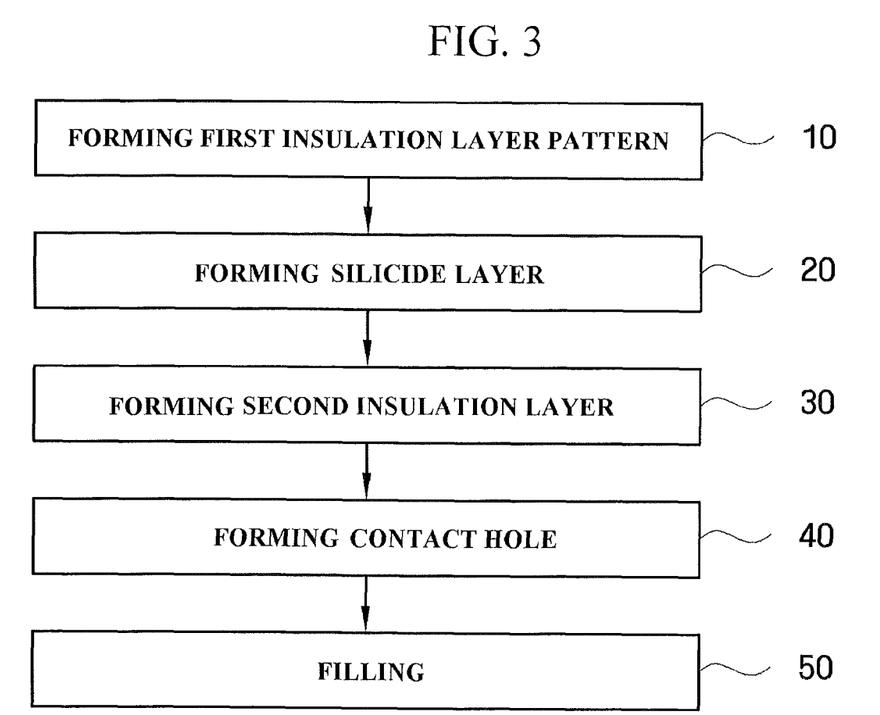
FIG. 3 is a flow chart illustrating operations corresponding to methods of manufacturing a semiconductor device according to some embodiments disclosed herein.

Hereinafter, methods of manufacturing a semiconductor device according to some embodiments disclosed herein will now be described with reference to FIGS. 3 and 4A through 4G. FIG. 3 is a flow chart illustrating operations corresponding to methods of manufacturing a semiconductor device according to some embodiments herein, and FIGS. 4A through 4G are cross-sectional views illustrating operations of the methods of manufacturing a semiconductor device shown in FIG. 3.

Referring to FIG. 3, the methods of manufacturing a semiconductor device according to some embodiments include forming a first insulation layer pattern (block 10), forming a silicide layer (block 20), forming a second insulation layer (block 30), forming a contact hole (block 40), and filling (block 50).

Figure 4A:
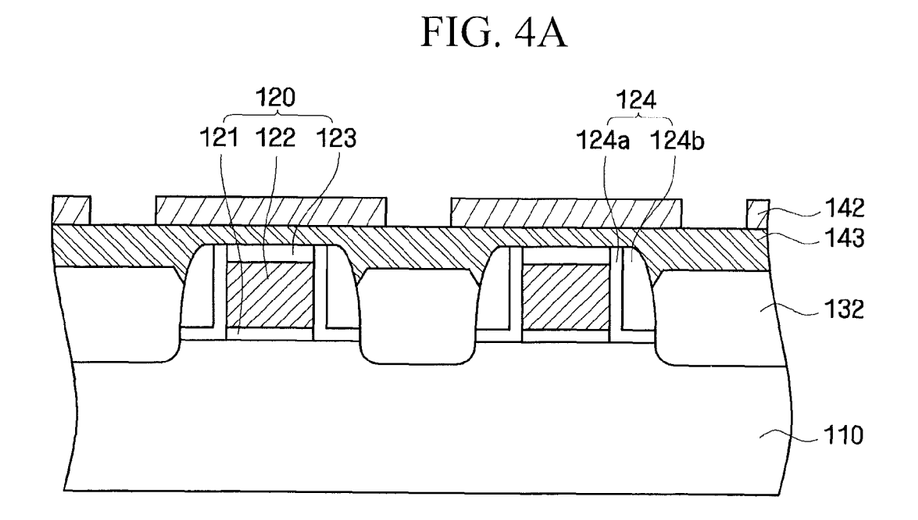
FIGS. 4A through 4G are cross-sectional views illustrating operations corresponding to methods of manufacturing a semiconductor device shown in FIG. 3.
Figure 4B:
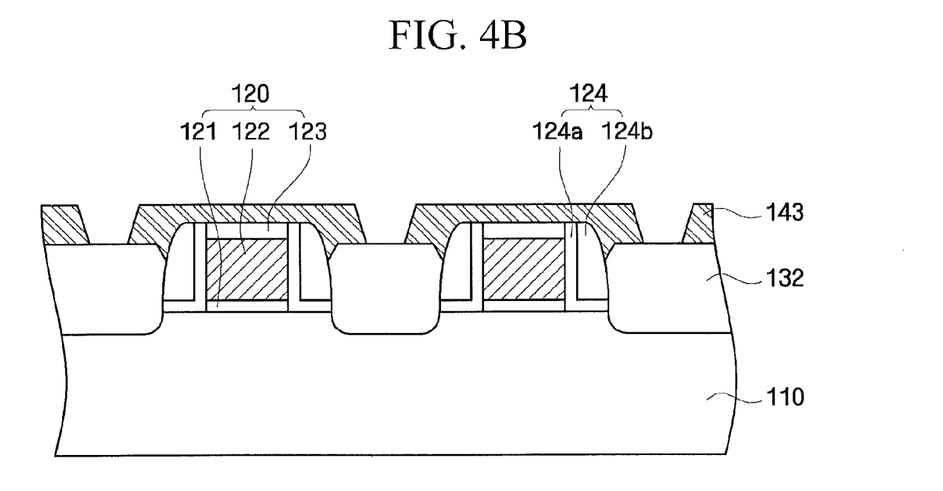

Referring to FIGS. 4A and 4B, a first insulation layer pattern 143 is formed on a substrate having a gate pattern 120 and a source/drain region 132 formed at both sides of the gate pattern 120 (FIG. 3, block 10).

In detail, a first insulation layer 143' is deposited to cover the entire surface of the gate pattern 120 and the source/drain region 132, a photoresist pattern 142 is formed on the first insulation layer 143', and a photolithography process is performed using the photoresist pattern 142 as an etch mask, thereby forming the first insulation layer pattern 143 having a predetermined exposed portion of the source/drain region 132. The first insulation layer 143' may be formed of a silicon oxide film or a silicon nitride film.

Here, the gate pattern 120 may have a stacked structure in which the gate insulation layer 121, the gate electrode 122 and the hard mask film 123 are sequentially stacked. In some embodiments, the hard mask film 123 may be omitted.

The gate spacer 124 having a single layered structure or a double layered structure may be formed on sidewalls of the gate pattern 120 and the gate electrode 120b to protect the gate electrode 120b. FIG. 4B illustrates that the gate spacer 124 has a double layered structure of an oxide film 124a and a nitride film 124b.

The source/drain region 132 may be formed at both sides of the gate pattern 120 to have a predetermined height so as to have a structure in which the source/drain region 132 is elevated from the surface of the substrate 110. In addition, the source and drain region may be formed through epitaxial growth. Further, the source/drain region 132 may be an epitaxial silicon layer formed in the trench recessed into the substrate 110 to a predetermined depth.

Methods for forming the source/drain region of a PMOS transistor will now be described in more detail. First, a lightly doped source/drain region is formed by implanting low concentration impurity ions using the gate pattern as an etch mask, and then a gate spacer is formed, followed by implanting high-concentration impurity ions using the gate pattern and the gate spacer as etch masks, thereby forming a heavily doped source/drain region. Subsequently, a predetermined region of the substrate exposed by the gate pattern and the gate spacer is etched to form a trench, and a SiGe epitaxial layer is formed in the trench. Here, the trench may have a hexagonal profile, and the trench may be etched such that a tip of the trench having a maximum width is positioned on the same line with sidewalls of the gate pattern.

Here, the source/drain region 232 formed of an epitaxial layer and the gate pattern 120 may have an aspect ratio of 3:1 or less. In addition, the source/drain region 232 and the gate pattern 120 may have a step difference of 250 Å or less. A top portion of the gate pattern 120 and a top portion of the source/drain region 132 are positioned at the same height. Since the gate pattern 120 and the source/drain region 132 have a step difference of 250 Å or less, the aspect ratio thereof are reduced, thereby achieving uniform deposition of the first insulation layer 143'.

Figure 4C:
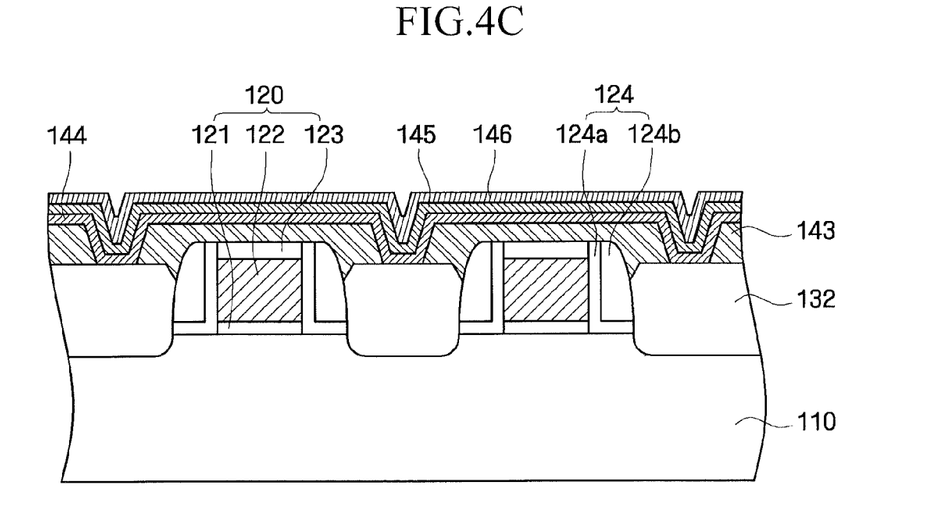
Figure 4D:
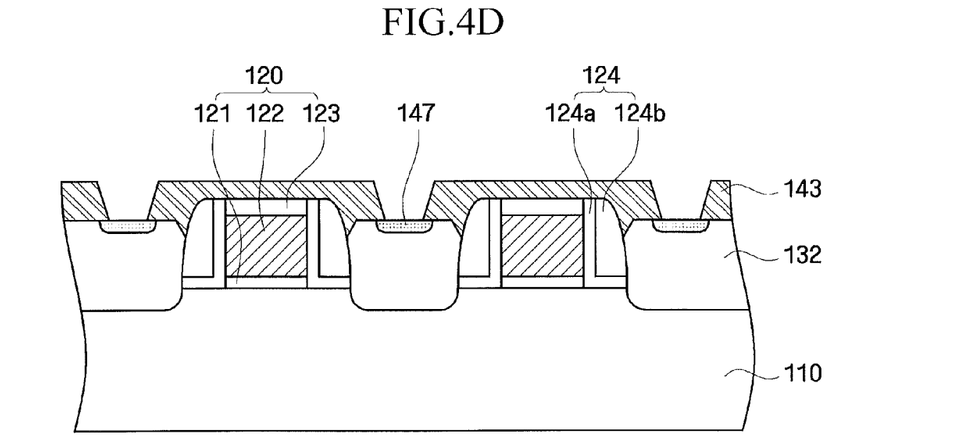

Referring to FIGS. 4C and 4D, metal layers 144, 145 and 146 are deposited on a predetermined portion of the source/drain region exposed in operations corresponding to block 10 and the first insulation layer pattern 143 to react with silicon of the source/drain region 132 to form the silicide layer 147 (FIG. 3, block 20).

In detail, forming the silicide layer 147 may include forming a single layer or a multi-layered metal layers 144, 145 and 146 containing Ni, Co, Pt, Ti or an alloy thereof on the exposed source/drain region and the first insulation layer pattern 143. An annealing process is performed at a temperature of approximately 500 degrees C. to approximately 800 degrees C. to react the deposited metal with silicon of the source/drain region 132 and remove unreacted metal using an etching process, thereby forming the silicide layer 147. That is to say, the silicide layer 147 of the illustrated embodiments may be formed through a salicide (self aligned silicide) process. The silicide layer 147 resulting from the reacting of the deposited metal layer with silicon may be permeated into the source/drain region 132. While FIG. 4D illustrates that the silicide layer 147 is substantially completely permeated into the source/drain region 132, the invention is not limited thereto and the silicide layer 147 may protrude toward the top portion of the source/drain region 132.

In the illustrated embodiments, before forming a contact hole, the silicide layer 147 is formed on the source/drain region 132. In a case where the silicide layer 147 is formed after forming the contact hole, a metal layer may not be uniformly deposited in the contact hole due to a large aspect ratio of the contact hole, making it difficult to form a sufficiently thick silicide layer. In the illustrated embodiments, however, the silicide layer may be formed before forming the contact hole and the gate pattern and the source/drain region may have a small aspect ratio. In this manner, a silicide layer having a uniform thickness may be formed. In addition, since the first insulation layer pattern 143 serves to protect a gate electrode, it is possible to reduce or prevent damage to the gate electrode when the unreacted metal is etched.

Figure 4E:
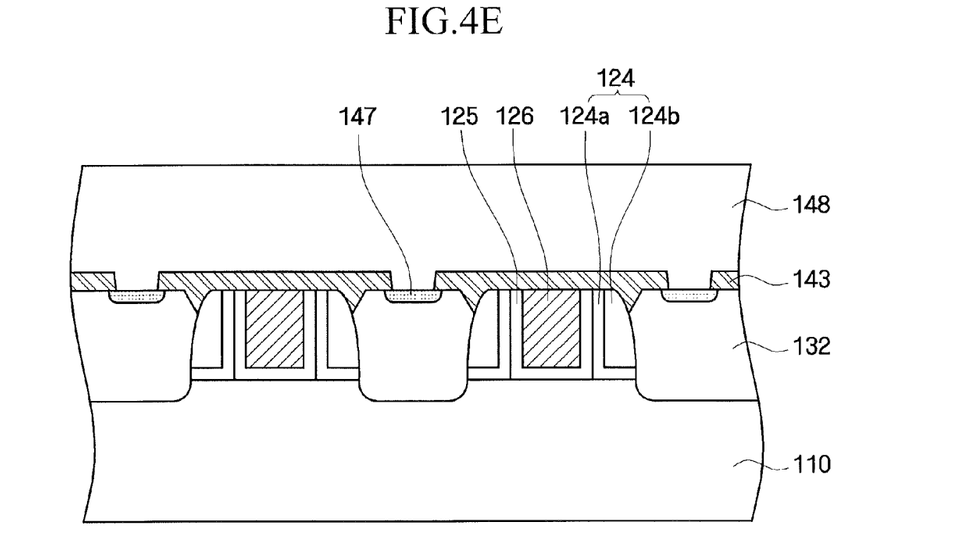

Referring to FIG. 4E, the second insulation layer 148 is formed on the silicide layer 147 and the first insulation layer pattern 143 (FIG. 3, block 30). In detail, a silicon oxide film or a silicon nitride film substantially completely covering top surfaces of the silicide layer 147 and the first insulation layer pattern 143 is deposited, thereby forming the second insulation layer 148. The first insulation layer 143' and the second insulation layer 148 may be made of different materials. Specifically, the first insulation layer 143' may be formed of a silicon nitride film, while the second insulation layer 148 may be formed of a silicon oxide film.

Figure 4F:
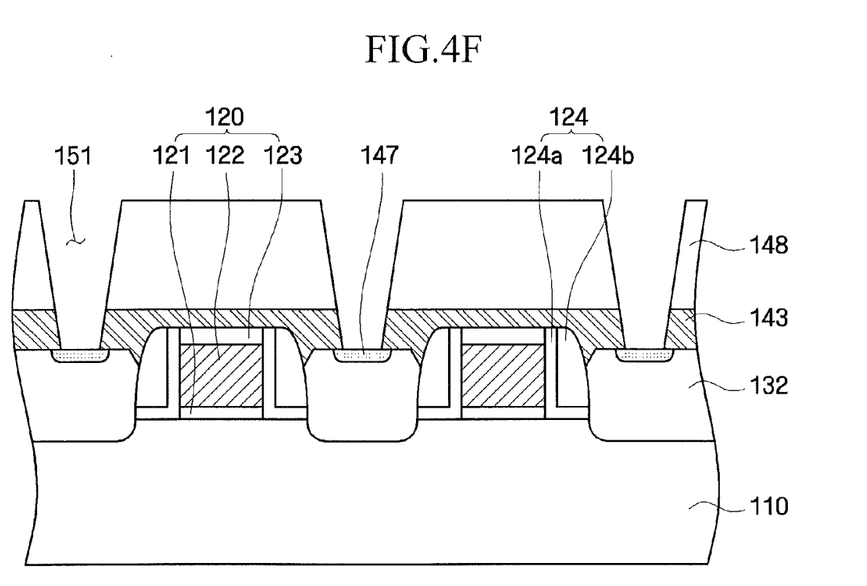

Referring to FIG. 4F, a contact hole 151 is formed on the silicide layer 147 (FIG. 3, block 40). In detail, the contact hole 151 is formed by etching the second insulation layer 148 so as to expose the silicide layer 147. The etching of the second insulation layer 148 may be performed by a method known in the art. Through the above-described process, the silicide layer 147 exists to a lower portion of the contact hole 151, and it is not necessary to separately form a silicide layer in the contact hole 151. In the process of etching the second insulation layer 148 in order to form the contact hole 151, the first insulation layer 143' may be used as an etch stopper, thereby preventing the gate electrode 122 from being damaged.

Figure 4G:
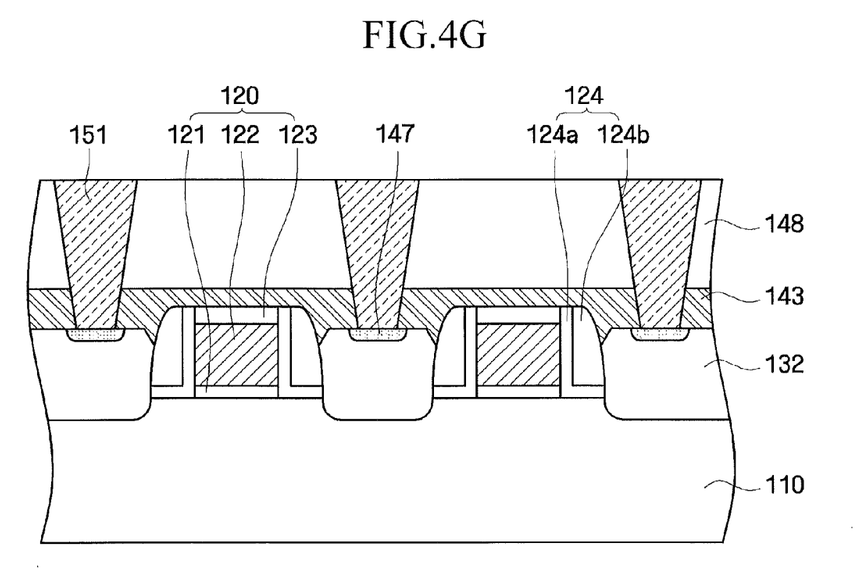

Referring to FIG. 4G, a conductive material is filled in the contact hole 151 (FIG. 3, block 50). In detail, the inside of the contact hole 151 is filled with a conductive material such as a metal, thereby forming a metal wire contact. Specifically, tungsten (W) may be used as the metal.

Figure 5:
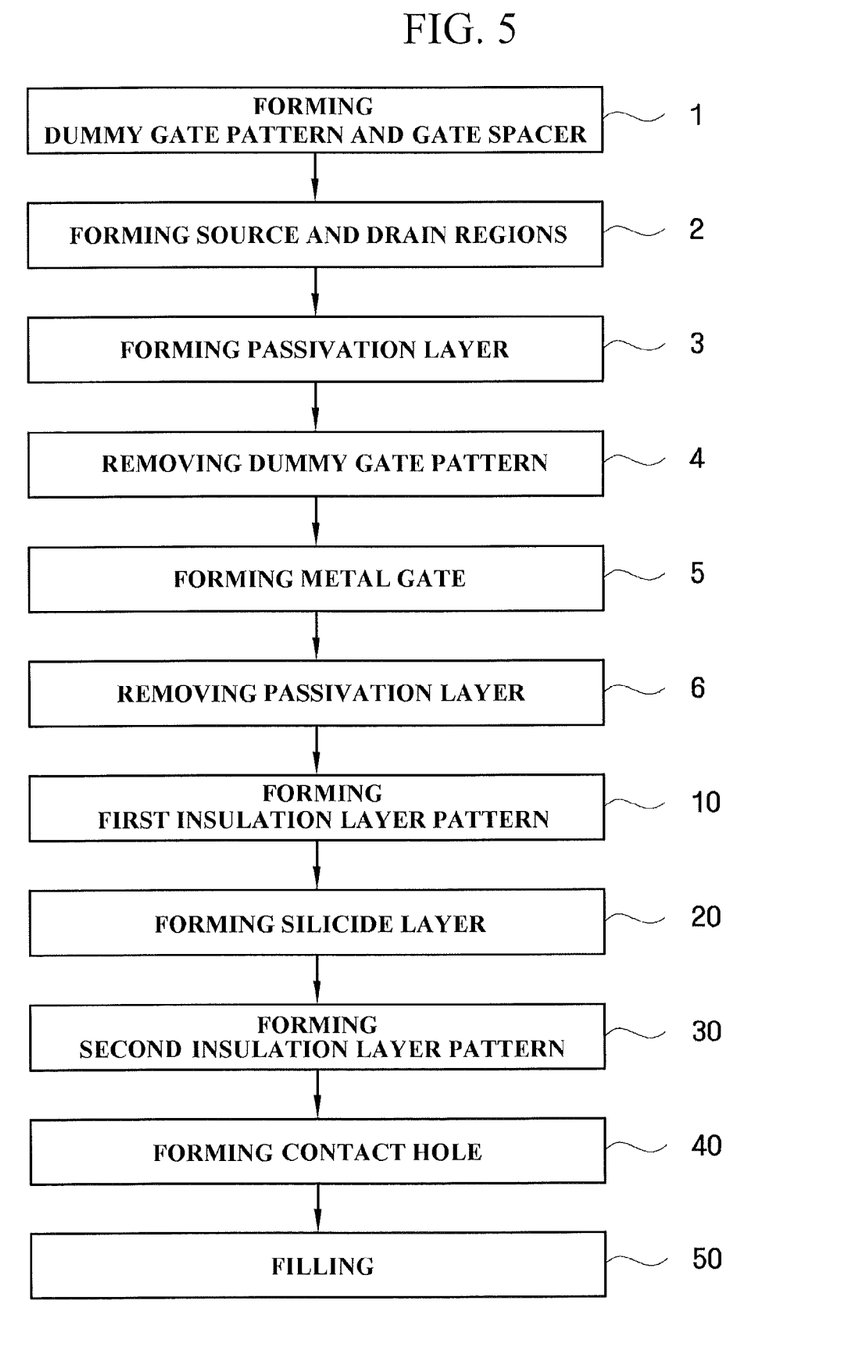
FIG. 5 is a flow chart illustrating operations corresponding to methods of manufacturing a semiconductor device according to some other embodiments disclosed herein.
Figure 6A:
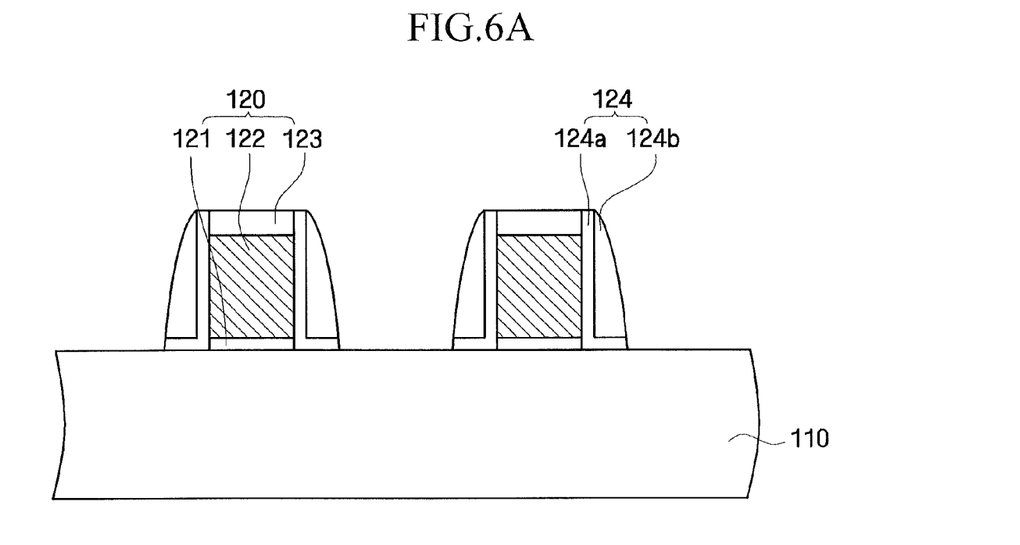
FIGS. 6A through 6N are cross-sectional views illustrating operations corresponding to methods of manufacturing a semiconductor device shown in FIG. 5.
Figure 6B:
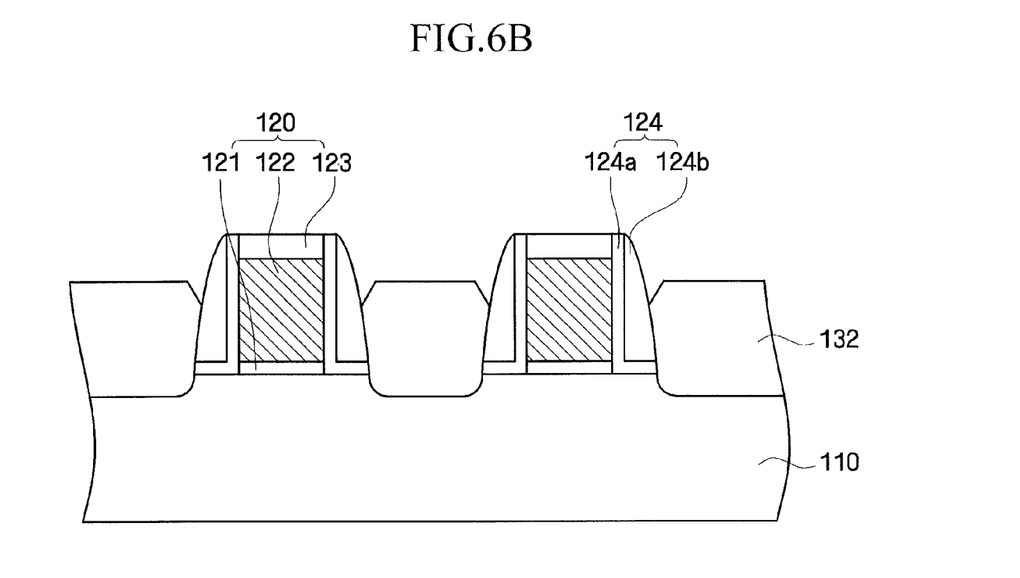
Figure 6C:
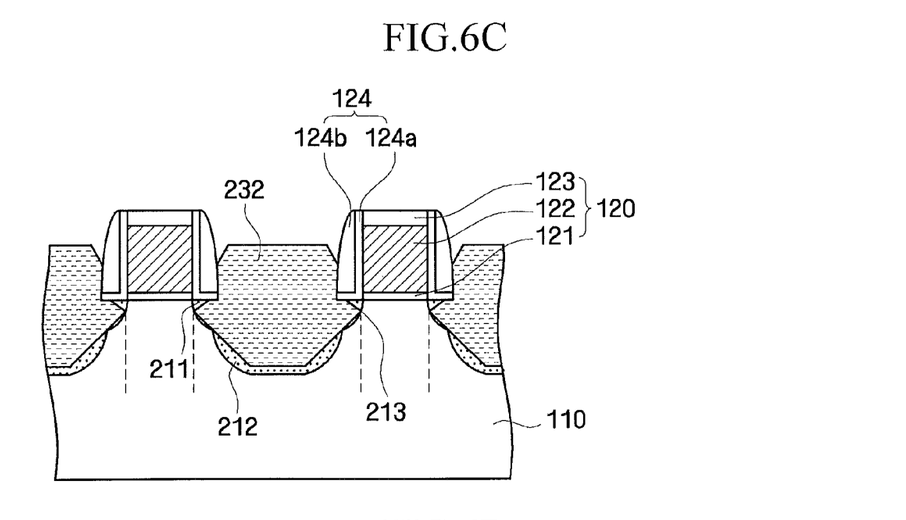
Figure 6D:
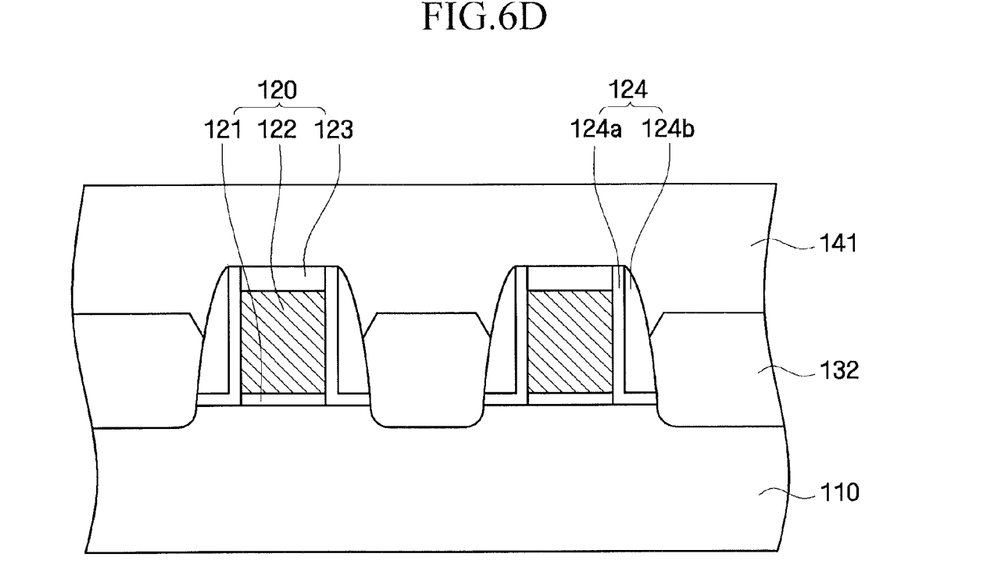
Figure 6E:
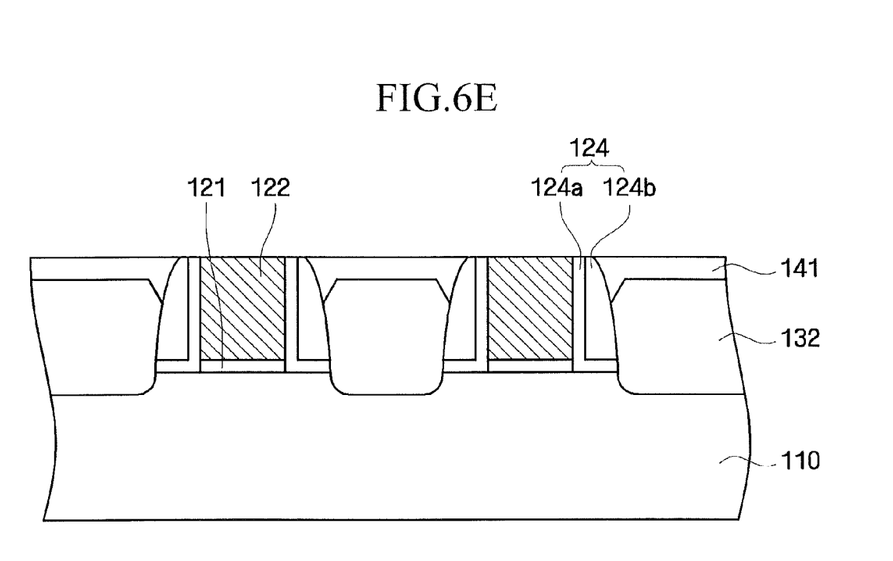
Figure 6F:
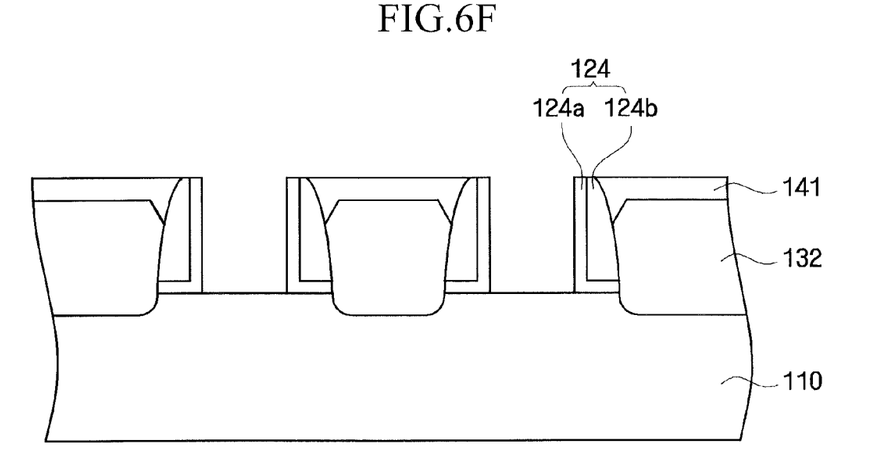
Figure 6G:
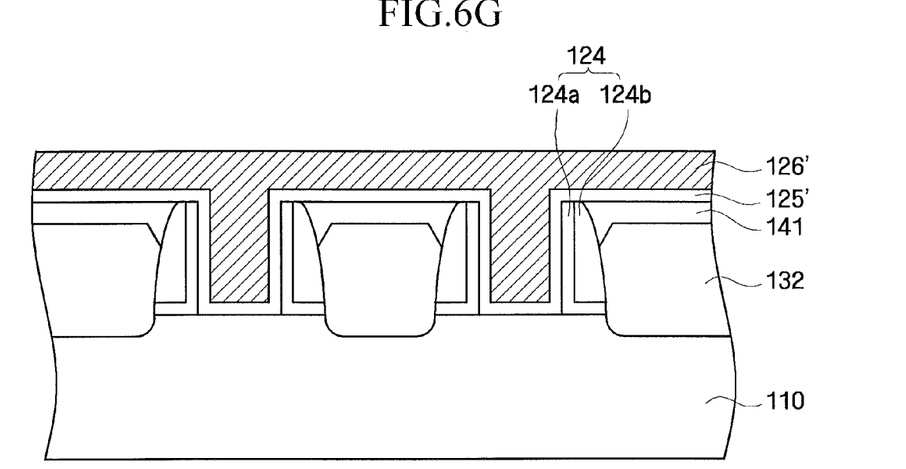
Figure 6H:
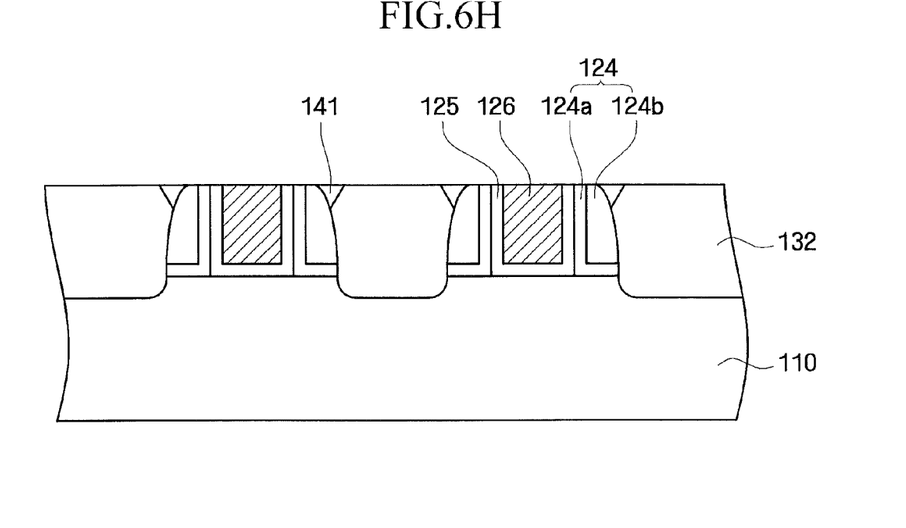
Figure 6I:
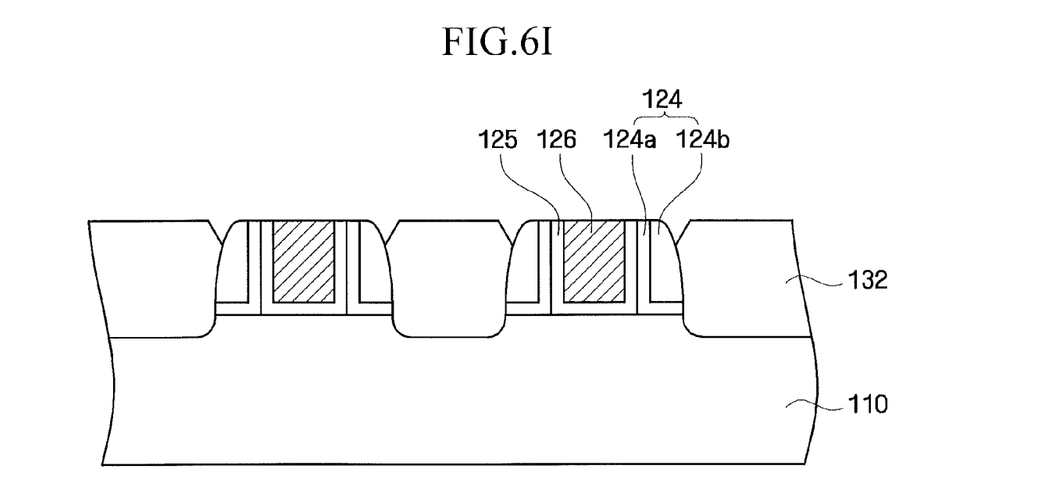
Figure 6J:
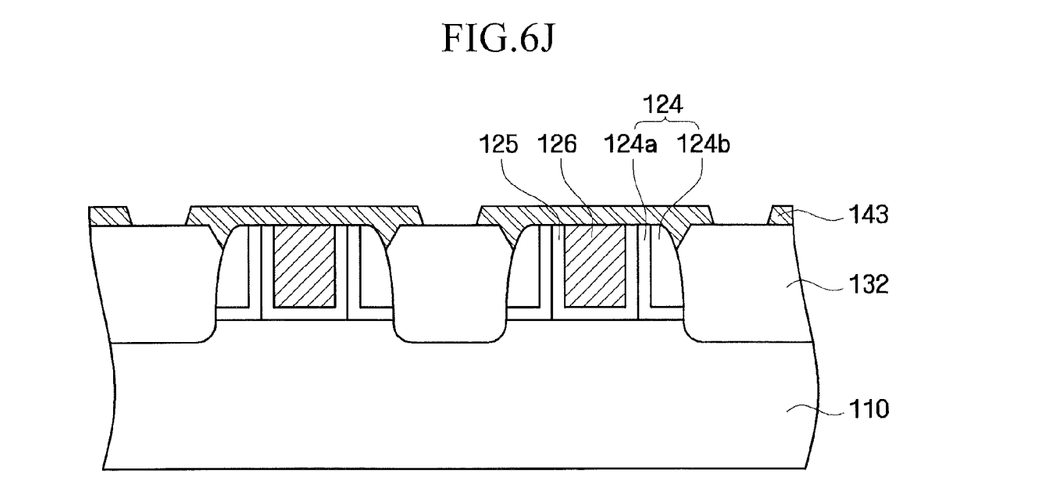
Figure 6K:
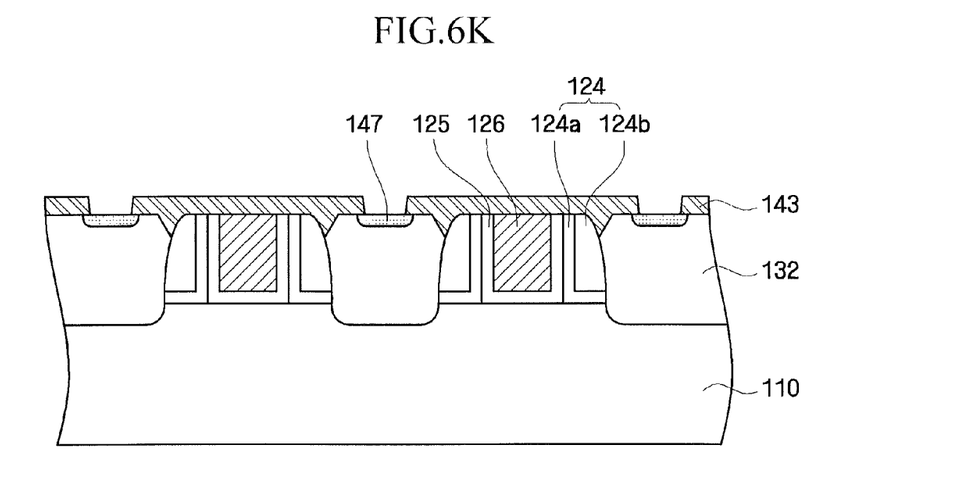
Figure 6L:
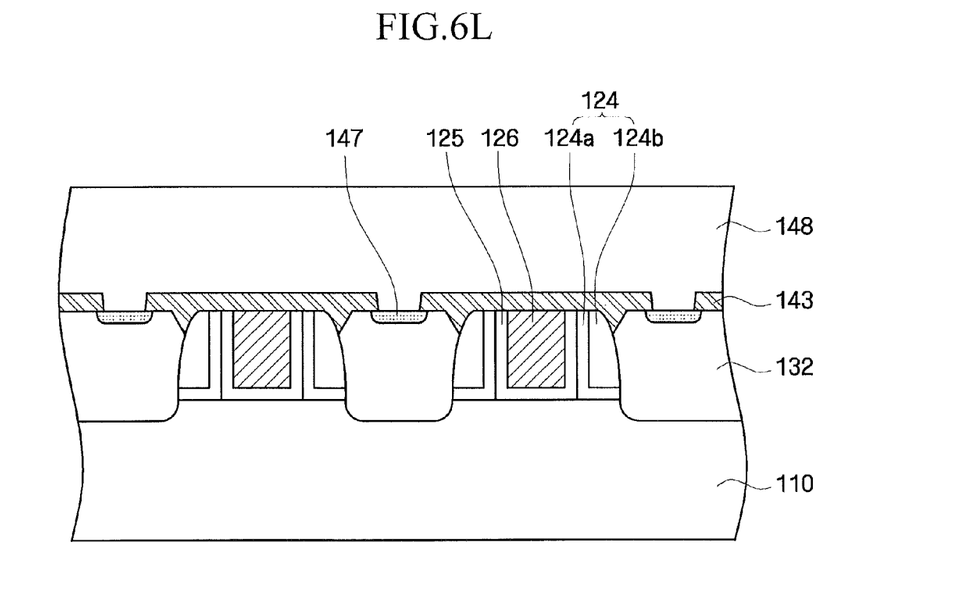
Figure 6M:
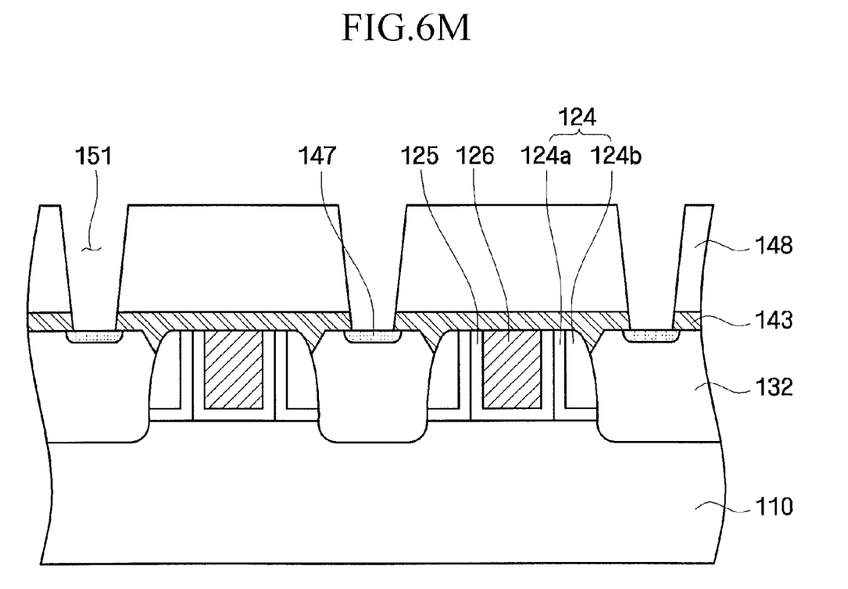
Figure 6N:
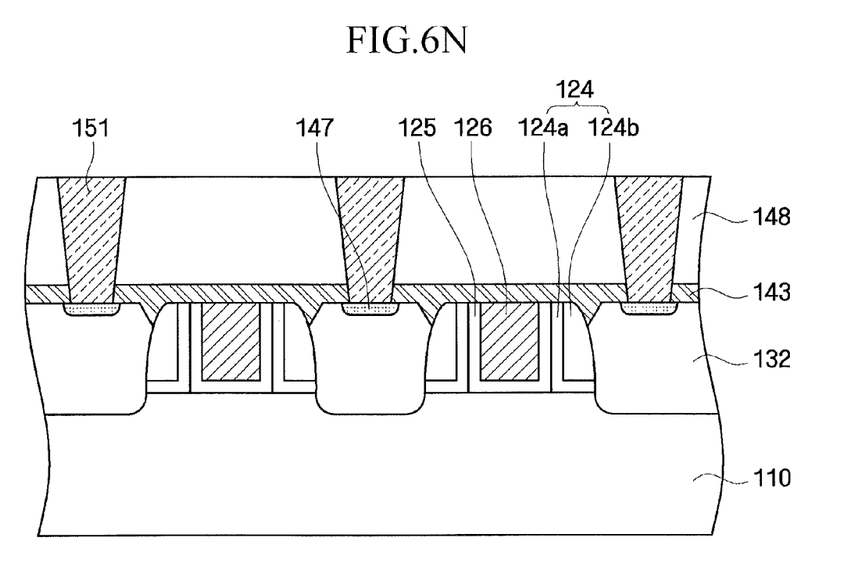

Reference is now made to FIG. 5, which is a flow chart illustrating operations corresponding to methods of manufacturing a semiconductor device according to some embodiments disclosed herein and to FIGS. 6A through 6N, which are cross-sectional views illustrating operations corresponding to the methods of manufacturing a semiconductor device shown in FIG. 5. For brevity of explanation, in the methods of manufacturing the semiconductor device according to the illustrated embodiments, portions that are the same as or similar to those of the method of manufacturing the semiconductor device according to the previous embodiment are denoted by the same reference numerals, and a detailed explanation thereof may be omitted. Accordingly, the following description of the illustrated semiconductor device will focus on the differences.

Referring to FIG. 5, operations include forming a dummy gate pattern and a gate spacer (block 1), forming a source/drain region (block 2), forming a passivation layer (block 3), removing the dummy gate pattern (block 4), forming a metal gate (block 5) and removing the passivation layer (block 6). In addition to, the methods of manufacturing the semiconductor device according to the illustrated embodiment of the present invention may further include steps of forming a first insulation layer pattern (block 10), forming a silicide layer (block 20), forming a second insulation layer (block 30), forming a contact hole (block 40) and filling (block 50).

Referring to FIG. 6A, the dummy gate pattern 120 and the gate spacer 124 are formed on the substrate 110 (FIG. 5, block 1). In detail, a first insulation layer, a polysilicon layer, and a second insulation layer are sequentially stacked on the substrate 110 and patterned to form a dummy gate pattern 120 having a stacked structure in which the gate insulation layer 121, the dummy gate 122 and the hard mask film 123 are sequentially stacked. Next, an insulation layer for a first spacer and an insulation layer for a second spacer are sequentially formed on sidewalls of the gate pattern 120 and etched to form a gate spacer 124. The first spacer 124a is formed of a silicon oxide film, while the second spacer 124b may be formed of a silicon nitride film. Some embodiments provide that the hard mask film 123 may be omitted.

Referring to FIG. 6B, the source/drain region 132 is formed at both sides of the dummy gate pattern 120, respectively (FIG. 5, block 2). In detail, the source/drain region 132 doped with impurity ions is formed at both sides of the gate pattern 120 through epitaxial growth, respectively. The epitaxial process for forming the source/drain region 132 may be performed at a temperature of approximately 500 degrees C. to about 900 degrees C. under approximately 1 to 500 torr using a selective epitaxial growth process such as a low pressure chemical vapor deposition (LPCVD), ultrahigh vacuum chemical vapor deposition (UHV-CVD), or the like, but may be appropriately adjusted within the scope of the present invention. The source/drain region 132 may be formed of an epitaxial layer such as Si, SiC or SiGe. In the epitaxial process, $SiH_4$, $SiH_2Cl_2$, $SiHCl_3$, $SiCl_4$, $SiH_xCl_y(x+y=4)$, $Si(OC_4H_9)_4$, $Si(OCH_3)_4$, $Si(OC_2H_5)_4$, or the like, may be used as a silicon source material, $GeH_4$, $GeCl_4$, $GeH_xCl_y(x+y=4)$, or the like, may be used as a germanium source material, and $C_xH_y$, $CH_3SiH_3$, or the like, and/or may be used as a carbon source material, among others. In order to improve selective characteristics, a gas such as HCl or $Cl_2$ may also be added. Specifically, for the purpose of doping, a gas such as $B_2H_6$, $PH_3$, $AsH_3$, or the like may be added.

As shown in FIG. 6C, the source/drain region 232 of PMOS may be formed of an epitaxially grown silicon germanium layer. The silicon germanium layer is formed through epitaxial growth in a trench formed by etching a predetermined portion of the substrate 110. The lightly doped source/drain region 211 and the heavily doped source/drain region 212 surround a peripheral portion of the trench, and the trench may have a hexagonal profile. A tip 213 of the trench may be positioned on the same line or aligned with sidewalls of the dummy gate pattern 120.

In some embodiments, an aspect ratio of the source/drain region 132 to the dummy gate pattern 120 may be 3:1 or less. Some embodiments provide that the source/drain region 132 may be formed to have a step difference of 250 Å or less with respect to a top surface of the dummy gate pattern 120. The smaller the step difference between the source/drain region 132 and the gate pattern 120, the smaller the aspect ratio, thereby achieving substantially uniform deposition in a subsequent process.

Referring to FIG. 6D, a passivation layer 141 covering the gate pattern 120 and the source/drain region 132 is formed (FIG. 5, block 3). In detail, the passivation layer 141 that is an interlayer dielectric layer is formed on the entire surface of the substrate 110 to cover the gate pattern 120 and the source/drain region 132. The passivation layer 141 may be formed of a silicon oxide film, a silicon nitride film, or a double layer of these films.

Referring to FIGS. 6E and 6F, the passivation layer 141 is removed to expose the dummy gate pattern 120 and the exposed dummy gate pattern 120 is removed to expose the substrate 110 (FIG. 5, block 4). In detail, the passivation layer 141 is polished by a chemical mechanical polishing (CMP) process to expose the dummy gate pattern 120 and the exposed dummy gate pattern 120 is removed by a selective etching process to expose the substrate 110. In such a manner, a trench is formed in a region from which the dummy gate pattern 120 is removed.

FIGS. 6G and 6H, an insulation layer 125' and a metal layer 126' are sequentially stacked and planarized on the passivation layer 141 while filling the trench, thereby forming the gate insulation layer 125 and the metal gate 126 (FIG. 5, block 5). Specifically, the insulation layer 125' and the metal layer 126' are sequentially stacked in the trench formed after removing the passivation layer 141 and the dummy gate pattern 120, and then planarized by etching the insulation layer 125' and the metal layer 126', thereby allowing the passivation layer 141 to be exposed. Here, since there is a small difference between the source/drain region 142 and the gate pattern 120, the passivation layer 141 on the source/drain region 132 is substantially completely removed in the process of etching the passivation layer 141, thereby achieving planarization so that the source/drain region 142 and the metal gate 126 have the same height from the substrate 110. The insulation layer 125' may generally be formed a silicon oxide film or made of an insulating material such as $Ta_2O_5$, $Al_2O_3$, and the metal layer 126' may be made of tungsten (W), WN, Ti, TiN, Mo, and/or Ta, among others.

Through the above-described manner, a poly-gate electrode made of polysilicon is removed to form a metal gate. The metal gate may achieve low resistance in a finer line width than the poly-gate.

Referring to FIG. 6I, the passivation layer 141 remaining on the source/drain region 132 is removed (FIG. 5, block 6). In detail, a top portion of the source/drain region 132 is exposed by etching the exposed passivation layer 141. Here, the passivation layer filling a gap created due to a facet of the source/drain region 132 is substantially completely removed.

FIG. 6J is a cross-sectional view illustrating forming a first insulation layer pattern (FIG. 5, block 10). FIG. 6K is a cross-sectional view illustrating forming a silicide layer (FIG. 5, block 20), FIG. 6L is a cross-sectional view illustrating forming a second insulation layer (FIG. 5, block 30), FIG. 6M is a cross-sectional view illustrating forming a contact hole (FIG. 5, block 40), and FIG. 6N is a cross-sectional view illustrating filling (FIG. 5, block 50). Since the steps of forming a first insulation layer pattern (block 10), forming a second insulation layer (block 30), forming a contact hole (block 40), and filling (block 50) are substantially the same as those described in the methods of manufacturing a the semiconductor device according to previous embodiments, and a detailed description thereof will not be given.

In the methods of manufacturing the semiconductor device according to the illustrated embodiments disclosed herein, a step difference between the gate pattern and the source/drain region is small to reduce the aspect ratio, thereby obtaining a uniformly deposited film in a subsequent process. In addition, since a silicide layer is formed on the source/drain region before forming the contact hole, it is not necessary to form a separate silicide layer into the contact hole. Further, it is possible to reduce or prevent damage to the metal gate in a salicide process.

While the present disclosure has been particularly shown and described with reference to example embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the disclosure.

What is claimed is:

1. A semiconductor device comprising:
   a gate pattern comprising a gate insulation layer and a gate electrode formed on a substrate;
   a source/drain region formed at substantially opposite sides of the gate pattern;
   a silicide layer formed on the source/drain region;
   an insulation layer formed on the gate pattern and the source/drain region; and
   a contact hole formed through the insulation layer and exposing a predetermined region of the silicide layer,
   wherein the gate pattern and the source and drain regions have a step difference between a top portion of the gate pattern and a top portion of the source and drain regions of about 250 Å or less from the substrate,
   wherein the gate pattern and the source/drain region have an aspect ratio of less than about 3:1, and
   wherein the aspect ratio is a ratio of the step difference between the top portion of the gate pattern and the top portion of the source/drain region to a width of the source/drain region.

2. The semiconductor device of claim 1, wherein the gate electrode is formed of a metal containing material.

3. The semiconductor device of claim 1, wherein the source/drain region is formed by epitaxially growing a silicon germanium layer in a trench formed by etching a predetermined region of the substrate.

4. The semiconductor device of claim 3, wherein the trench has a hexagonal profile.

5. The semiconductor device of claim 1, wherein the insulation layer includes a first insulation layer formed on the gate pattern and the source/drain region and a second insulation layer formed on the first insulation layer, and the first insulation layer and the second insulation layer have different etch ratios.

6. The semiconductor device of claim 5, wherein the first insulation layer is formed of SiN and wherein the second insulation layer is formed of silicon oxide.

* * * * *